United States Patent
Okazawa

(10) Patent No.: US 7,405,958 B2
(45) Date of Patent: Jul. 29, 2008

(54) MAGNETIC MEMORY DEVICE HAVING XP CELL AND STR CELL IN ONE CHIP

(75) Inventor: Takeshi Okazawa, Kanagawa (JP)

(73) Assignee: NEC Electronics Corporation, Tokyo (JP)

( * ) Notice: Subject to any disclaimer, the term of this patent is extended or adjusted under 35 U.S.C. 154(b) by 42 days.

(21) Appl. No.: 10/464,010

(22) Filed: Jun. 18, 2003

(65) Prior Publication Data
US 2003/0235071 A1 Dec. 25, 2003

(30) Foreign Application Priority Data
Jun. 20, 2002 (JP) ............................. 2002-180081

(51) Int. Cl.
*G11C 5/08* (2006.01)
*G11C 11/00* (2006.01)
*G11C 8/00* (2006.01)
*G11C 8/02* (2006.01)

(52) U.S. Cl. .................... 365/66; 365/130; 365/132; 365/158; 365/230.03; 365/232

(58) Field of Classification Search .................. 365/66, 365/130, 132, 158, 231, 232, 185.08, 55, 365/173, 230.03, 230.06
See application file for complete search history.

(56) References Cited

U.S. PATENT DOCUMENTS

| | | | |
|---|---|---|---|
| 4,559,616 A | | 12/1985 | Bruder |
| 5,524,094 A | * | 6/1996 | Nobukata et al. ...... 365/185.21 |
| 5,703,828 A | * | 12/1997 | Park et al. ............... 365/230.03 |
| 5,726,947 A | * | 3/1998 | Yamazaki et al. ...... 365/230.03 |
| 5,836,007 A | * | 11/1998 | Clinton et al. ............... 365/205 |
| 5,856,940 A | * | 1/1999 | Rao ............................ 365/149 |
| 6,005,814 A | * | 12/1999 | Mulholland et al. .......... 365/201 |
| 6,044,024 A | * | 3/2000 | Barth et al. ............. 365/189.08 |
| 6,049,497 A | * | 4/2000 | Yero .......................... 365/222 |
| 6,104,632 A | * | 8/2000 | Nishimura ................... 365/158 |
| 6,115,315 A | * | 9/2000 | Yoshida ................. 365/230.03 |

(Continued)

FOREIGN PATENT DOCUMENTS

DE 10121182 C1 * 10/2002

OTHER PUBLICATIONS

Durlam et al. NonVolatile RAM based on Magnetic Tunnel Junction Elements. IEEE 2000 pp. 130-131.

*Primary Examiner*—Ly D Pham
(74) *Attorney, Agent, or Firm*—Katten Muchin Rosenman LLP

(57) ABSTRACT

According to the semiconductor memory device of this invention, an XP type MRAM cell array and an STr type MRAM cell array are formed on a single chip. The XP type MRAM cell array is laid over the STr type MRAM cell array to form a layered structure. The STr type MRAM cell array serves as a work memory area, while the XP type MRAM cell array serves as a data storage area. A cell of the XP type MRAM cell array and a cell of the STr type MRAM cell array may be connected to a same bit-line. By passing predetermined current through the bit-line, and passing current through a first word-line connected to the cell of the XP type MRAM cell array, and through a second word-line connected to the cell of the STr type MRAM cell array, it is possible to simultaneously write data into the cells of the XP and STr type MRAM cell arrays.

18 Claims, 13 Drawing Sheets

U.S. PATENT DOCUMENTS

| | | | |
|---|---|---|---|
| 6,134,169 A * | 10/2000 | Tanaka | 365/222 |
| 6,236,590 B1 * | 5/2001 | Bhattacharyya et al. | 365/173 |
| 6,246,634 B1 * | 6/2001 | Nojima | 365/230.08 |
| 6,269,027 B1 | 7/2001 | Hurst, Jr. et al. | |
| 6,314,020 B1 * | 11/2001 | Hansen et al. | 365/158 |
| 6,335,890 B1 * | 1/2002 | Reohr et al. | 365/225.5 |
| 6,522,577 B1 * | 2/2003 | Earl et al. | 365/158 |
| 6,597,598 B1 * | 7/2003 | Tran et al. | 365/94 |
| 6,636,436 B2 * | 10/2003 | Perner | 365/158 |
| 6,741,513 B2 * | 5/2004 | Honigschmid et al. | 365/158 |
| 6,781,896 B2 * | 8/2004 | Lammers et al. | 365/200 |
| 6,839,260 B2 * | 1/2005 | Ishii | 365/51 |
| 7,030,488 B2 * | 4/2006 | Kiss | 257/723 |
| 2001/0002884 A1 * | 6/2001 | Hiraki et al. | 365/185.09 |
| 2001/0023922 A1 | 9/2001 | Doll | |
| 2002/0012266 A1 * | 1/2002 | Gogl et al. | 365/158 |
| 2002/0052633 A1 * | 5/2002 | Prutchi et al. | 607/36 |
| 2002/0074575 A1 * | 6/2002 | Bangert | 257/211 |
| 2002/0087805 A1 * | 7/2002 | Lee | 711/141 |
| 2002/0141232 A1 * | 10/2002 | Saito et al. | 365/158 |
| 2002/0197792 A1 * | 12/2002 | Hsu et al. | 438/246 |
| 2003/0080414 A1 * | 5/2003 | Kiss | 257/724 |
| 2003/0229831 A1 * | 12/2003 | Jeon | 714/718 |
| 2004/0013022 A1 * | 1/2004 | Boehm et al. | 365/222 |
| 2004/0174728 A1 * | 9/2004 | Takano et al. | 365/145 |
| 2004/0232497 A1 * | 11/2004 | Akiyama et al. | 257/390 |
| 2004/0264242 A1 * | 12/2004 | Nejad et al. | 365/158 |
| 2005/0040883 A1 * | 2/2005 | Saitoh | 327/541 |
| 2005/0128808 A1 * | 6/2005 | Sakui | 365/185.17 |

* cited by examiner

MAGNETIC MEMORY DEVICE HAVING XP CELL AND STR CELL IN ONE CHIP

BACKGROUND OF THE INVENTION

1. Field of the Invention

The present invention relates to a semiconductor memory device and a method of accessing it, particularly to a semiconductor memory device having a storage memory area and a working memory area.

2. Description of a Related Art

A conventional data processing system comprises at least a controller such as MPU, CPU, etc., for processing data and a memory device for storing data to be processed. Data has two types, one of which is necessary to maintain its information even after power is switched off, the other of which is used temporarily during data processing. The former data is stored in a non-volatile memory. The latter data is stored in a volatile memory to satisfy its high speed processing demand. The system engineer selectively use the two kinds of memories by storing the former in a storage memory and the latter in a working memory, based on the system to be designed. For example, a handy type information processing apparatus such as a mobile telephone, PDA, etc., use a flash memory as a storage memory and DRAM or SRAM as a working memory.

Regarding such a handy type information processing system, the miniaturization, weight saving, high-speed performance and diversity is demanded. To satisfy the demand, semiconductor memories such as DRAM, SRAM, etc. are developed.

However, there is some difficulty for system designer to use the two kinds of memory. For example, a flash memory requires as much as 1 μsec to store data, and thus, it takes a long time to write a control program into a mobile phone. This poses a problem, because, with the advent of high performance mobile phones in recent times, writing huge data such as a file of an animation film into a memory is required and actually tried even in those mobile phones, and this tendency is totally incompatible with said drawback of the flash memory, i.e., slowness in data writing. On the other hand, DRAM and SRAM have their own problem. DRAM does not have a bright prospect for high density integration because of its increasingly complicated procedures involved in the manufacture of its capacitor components. To ensure a required capacity, each capacitor component must have a certain height, and this hinders the progress of the device towards higher integration. To avoid this drawback, the capacitor component must be made of a material having a high dielectric constant, which will lead to an increased production cost. With respect to SRAM, each cell must include plural transistors, and thus to find a suitable method how to reduce a chip area becomes a problem. Thus, if one expects that DRAM or SRAM will serve as a memory through which he can handle a huge quantity of data at a high speed, he will meet a certain limitation sooner or later. Moreover, because the memory of a system consists of a non-volatile and volatile components, the production cost of the system is more increased than would be otherwise. Because access speeds to the two memory components are obviously different, management of the memory at large becomes difficult which complicates the designing of the system.

SUMMARY OF THE INVENTION

The present invention provides a semiconductor memory device including a cross-point type magnetic random access memory (MRAM) and a selective transistor type MRAM both being arranged on a single chip.

The MRAM is a non-volatile memory for magnetically storing data. The cross-point type MRAM (XP-MRAM) comprises an array including word-lines and bit-lines crossing with each other with a tunnel magnetic resistor (TMR) element implemented at each cross-point. The selective transistor type MRAM (STr-MRAM) comprises an array including word-lines and bit-lines crossing with each other with a TMR element with a selective transistor implemented at each cross-point. Reading data from the XP-MRAM requires about 1 μsec, and writing data into the same memory cell array requires 10-50 ns. Its integration density is equal to or higher than that of a flash memory with a comparable performance. Reading or writing data from or into the STr-MRAM requires 10-50 ns. Its integration density is equal to or higher than that of a DRAM with a comparable performance. As a reference, data reading or writing occurs at about 50 ns for DRAM, while data writing occurs at about 1 μs and data reading at 20-120 ns for a flash memory.

According to the semiconductor memory device of this invention, it is possible to use the XP-MRAM as a storage memory and STr-MRAM as a working memory. Thus, the present invention provides a semiconductor memory device comprising two memory components one of which may serve as a storage memory and the other as a working memory. If this device is employed to serve as a memory of a system, the system designer only needs to pay his attention to the management of data for address-lines and will be relieved of a burden required for designing a-system bus. The two MRAM components of a semiconductor memory device of this invention are arranged on a single chip, and may be fabricated by the same process applicable to MRAM which will reduce the production cost of the memory device, and the overall production cost of the system.

The semiconductor memory device of this invention preferably includes an access controller for controlling access to the memory cell arrays on the same chip. In addition to the access controller for controlling access to the memory cell arrays, the semiconductor memory device of this invention further includes a memory organization controller serving as a data processing unit (central processing unit (CPU) or micro-control unit (MCU)) on the same chip.

A memory chip representing a preferred embodiment of this invention is obtained by forming an STr-MRAM or a first memory component on a semiconductor substrate which comprises selective transistors placed on the semiconductor substrate, first word- and bit-lines crossed with each other with a first TMR element being implemented at each cross-point so as to be connected in series with corresponding selective transistors; and then by forming an XP-MRAM or a second memory component on the assembly where second word- and bit-lines are crossed with each other with a second TMR element being implemented at each cross-point; and by disposing a memory controller adjacent to the two memory components.

The STr-MRAM or the first memory component is used as a work memory area which, being controlled by CPU, enables reading/writing of data to be achieved at a high speed.

The XP-MRAM or the second memory component is used as a data storage area because of its having a comparatively high memory capacity per unit area (its cell having a comparatively small area).

The memory device of this invention comprises the STr-MRAM or a first memory component and XP-MRAM or a second memory component arranged on a single chip and a memory controller adjacent to them. The first and second TMR elements may have the same or different structures.

If the two TMR elements have different structures, the first TMR element must have a lower resistance than does the second one.

According to the memory device of this invention, even if each TMR element is the same in its basic structure, it is expectable to obtain a different performance by modifying the organization of arrays. Moreover, because the two memory components may be superimposed, it is possible to arrange the two memory components having different performances on a single chip, which will allow the overall memory capacity to be increased, hardly requiring extra area for this increase.

The memory device of this invention comprises an STr-MRAM which must be directly formed on a semiconductor substrate, and an XP-MRAM comprising essentially a wiring circuit with no notable solid element, which are superimposed in this order into a layered structure. This offers an optimal way for integrating the two memory components on a single chip.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DESCRIPTION OF THE PREFERRED EMBODIMENTS

Figure 1:
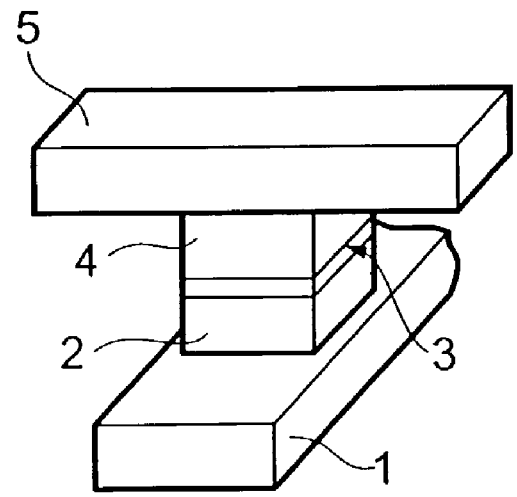
FIGS. 1(a) and 1(b) show the structure of an MRAM cell and programming and reading state of it.
Figure 1:
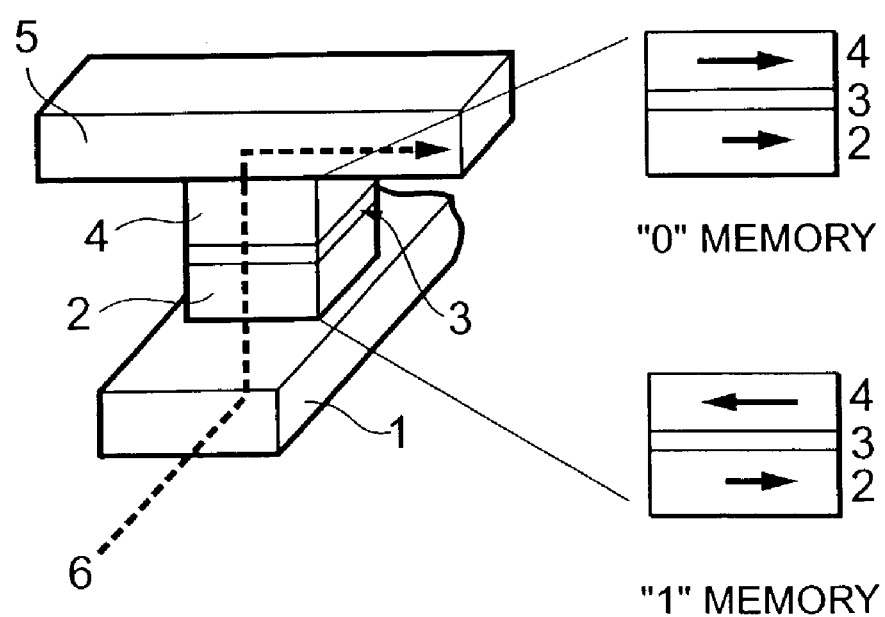

FIGS. 1(a) and 1(b) illustrate the basic structure of an MRAM cell and its operation.

As shown in FIG. 1(a), an MRAM cell comprises a pinned magnetic layer 2 as a permanent magnetic layer 2, made from a ferromagnetic substance with the magnetic direction being fixed; a free magnetic layer 4 as a variable magnetic layer, made from a ferromagnetic substance with the magnetic direction being variable, and serving as a data storing site; and a non-magnetic layer 3 being inserted between the above two layers. The non-magnetic layer includes, for example, a tunnel insulating film. An upper and lower lines are attached to the MRAM cell. The upper line 1 includes, for example, a word-line and the lower line a bit-line.

FIG. 1(b) illustrates how programming and reading of data performs at the memory cell.

Information is stored in a cell based on "magnetic resistance effect:" the resistance of the insulating membrane will differ by 30-40% if the variable magnetic layer 4 or data storing site changes its magnetic direction from one in parallel with that of the permanent magnetic layer to another oblique to the latter, or vice versa. Specifically, it is possible to produce binary states by passing predetermined currents through the upper and lower lines 5 and 1, and changing thereby the magnetic direction of the free magnetic layer 4 by an externally induced magnetic field.

Reading of data is achieved by supplying a predetermined voltage across the upper and lower lines 5 and 1, and passing thereby current from the lower line 1 through the pinned magnetic layer 2, insulating membrane 3, and free magnetic layer 4 to the upper line 5 as indicated by an arrow in the figure. Specifically, the current in question varies in accordance with a resistance across the insulating film which in turn changes depending on whether the magnetic direction of the free magnetic layer is in parallel with that of the pinned magnetic layer or not, and detection of how the current changes determines the binary state of the memory cell.

Figure 2:
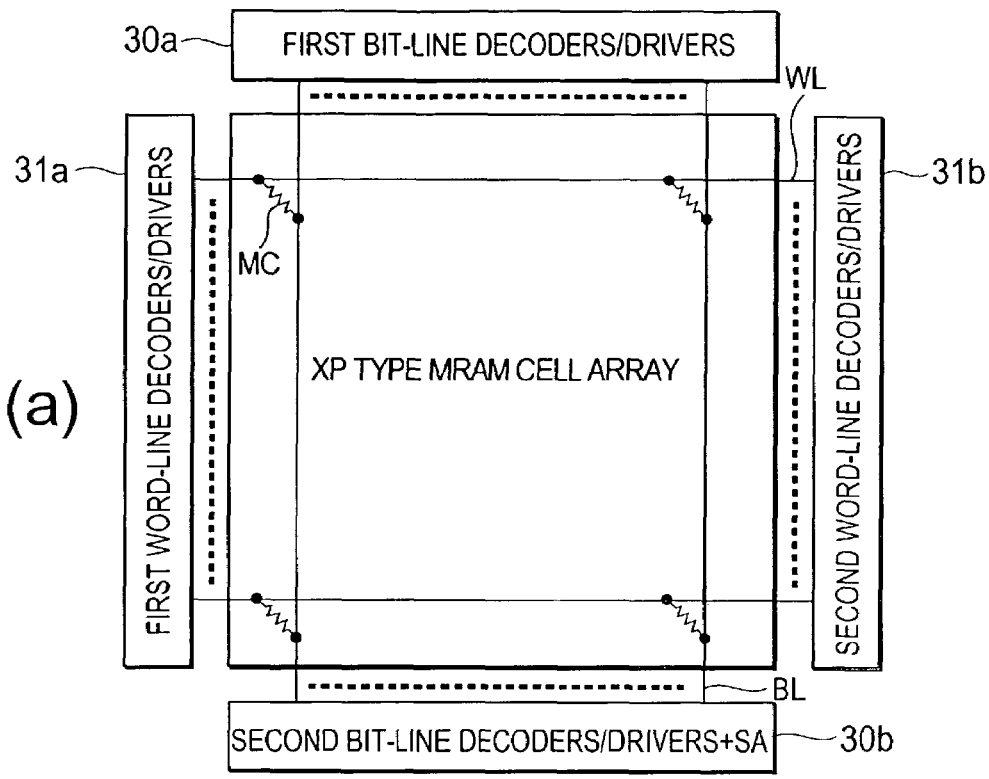
FIGS. 2(a) and 2(b) show the diagrams outlining the organization of an XP-MRAM and STr-MRAM, respectively.
Figure 2:
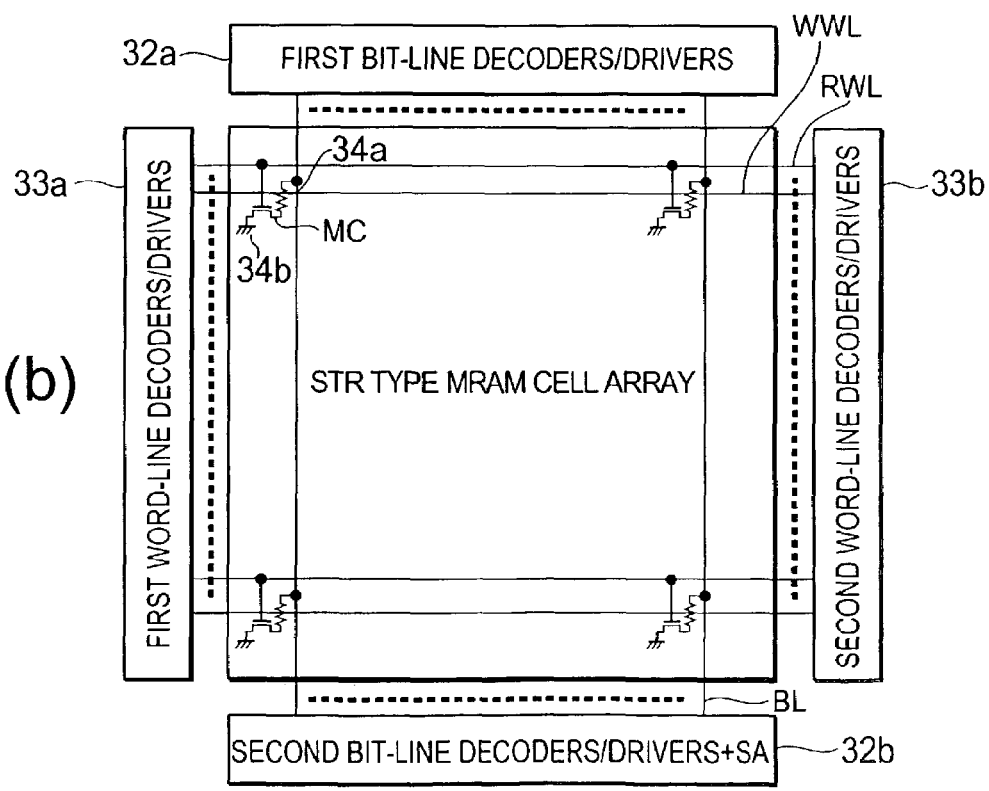

FIG. 2(a) shows the schematic view of an XP-MRAM.

The XP-DRAM comprises first and second word-line decoders/drivers 31a, 31b arranged at both ends of word-lines, and first and second bit-line decoders/drivers 30a, 30b arranged at both ends of bit-lines. The word-line decoder/driver receives a row address signal, and selects a word line corresponding with the address, and causes current to be passed through the word-line. The second word-line decoder/driver 31b can be omitted because word lines can select only by one decoder and current can supply only by one driver. On the other hand, the bit-line decoder/driver receives a column address signal, selects a bit-line based on the address, and causes current to be passed through the bit-line. The drivers 30a and 30b are needed at the both side of the memory cell array because the current flows bi-directionally in a bit line. At a cross-point where the word-line and the bit-line overlaps, a memory cell MC is implemented. Memory cells MCs are arranged in a matrix to form a memory cell array. A sense amplifier SA is provided in the end of bit line BL to detect the binary information retained by the selected memory cell MC via current passing through the cell and bit-line. The XP-MRAM has a simple structure, and ensures a low cost and high reliability. The XP-MRAM may comprise an array of word-lines and bit-lines crossing with each other with a memory cell MC and diode inserted in series at each cross-point. The XP-MRAM cell with the diode will have a higher rectifying activity, and thus a higher sensitivity.

FIG. 2(b) shows the schematic view of an STr-MRAM.

The STr-MRAM comprises write word-lines WWL and read word-lines RWL. First and second word-line decoders/drivers 33a, 33b are implemented at both ends of word-lines. On the other hand, first and second bit-lines 32a, 32b are implemented at both ends of bit-lines. The second word-line decoder/driver 33b can be omitted. A memory cell MC is implemented at each cross-point of a word-line pair with a bit-line. The memory cell MC comprises a TMR element 34a whose one end is connected to the bit line BL, and a selective transistor 34b which is inserted between the other end of TMR element 34a and the ground terminal. The gate of the selective transistor 34b is connected to the read write-line RWL. Writing data into the memory cell is achieved by using the write write-line WWL and read write-line RWL. Reading data from the cell is achieved by selecting the read write-line, passing current through the selected read write-line, and causing the sense amplifier to detect current passing through the TMR element 34a. M. Durlam et al., reported a research on the STr-MRAM at the fiscal 2000 ISSCC (International Solid-State Circuits Conference). According to their design, it is possible to totally eliminate the passage of current through non-selective cells. As a consequence, it becomes possible to increase the ratio of signal/background noise, and thus to reduce the time required for reading as compared with the XP-MRAM. The TMR element of the STr-MRAM may have a lower resistance than the counterpart of the XP-MRAM. This is because there is no by pass currents except for the one passing through a chosen memory cell MC in the STr-MRAM as described earlier. Thus, it is possible to lower the resistance of the TMR element and increase thereby current passing therethrough such that the time required for current detection can be reduced. By contrast, there are considerably bypass currents in the XP-MRAM. To cope with this, it is necessary to increase the resistance of each TMR element and to reduce thereby the passage of current therethrough. Specifically, the TMR element of the STr-MRAM has a resistance of about 10 kΩ while the counter part of the XP-MRAM has a resistance of 100-1000Ω.

Figure 3:
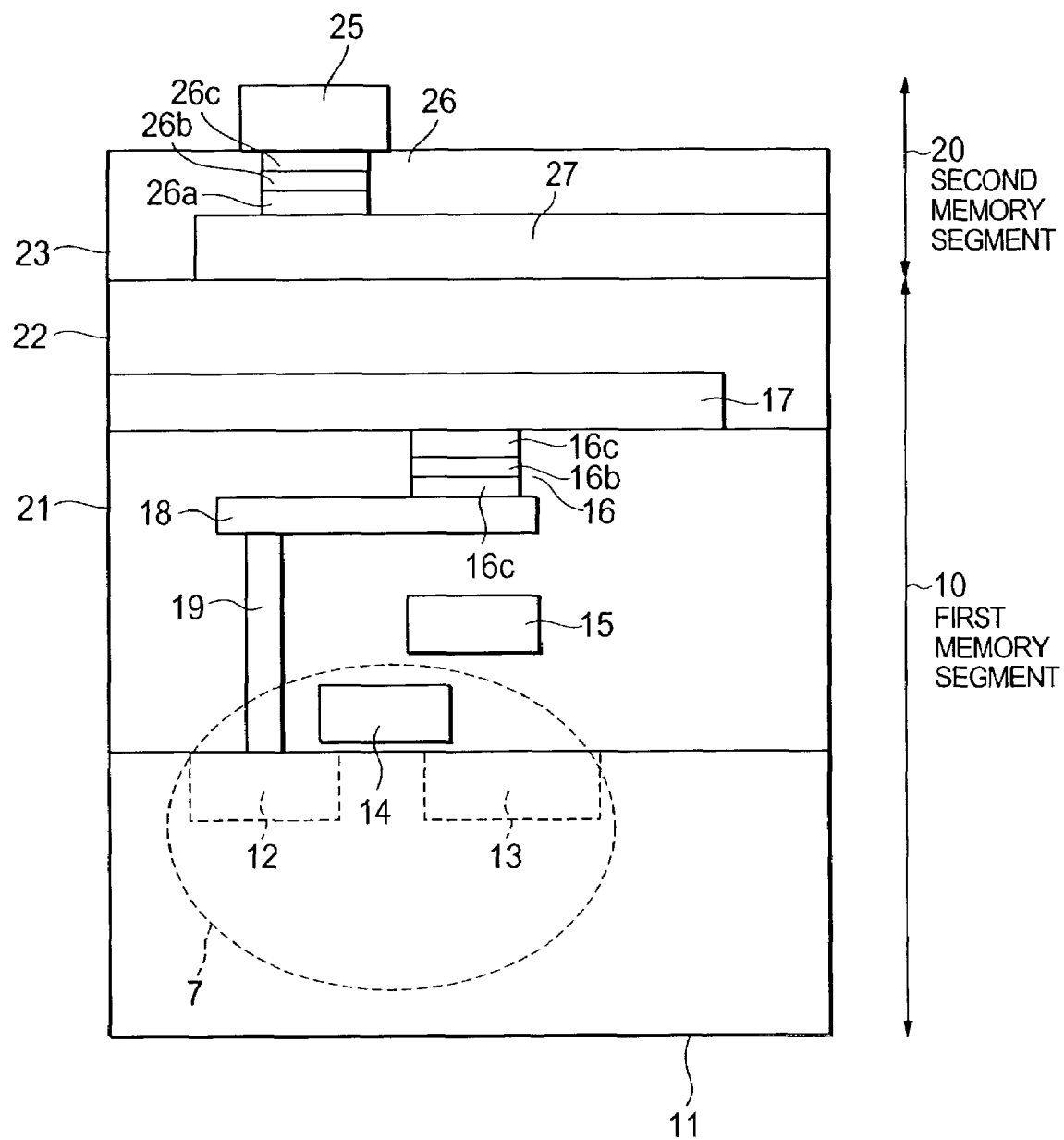
FIG. 3 shows the cross sectional view of a semiconductor memory device according to a first embodiment of the present invention.

FIG. 3 shows the semiconductor memory device according to the first embodiment of the present invention. FIG. 3 illustrates a sectional view of the memory area of MRAM of the present invention. As shown in the figure, a second memory segment 20 is placed above a first memory segment 10. Namely, the second memory segment 20 is superimposed on the first memory segment 10.

On the surface of semiconductor substrate 11 with one conductivity type, there are formed a drain 12 and a source 13 both having different conductivity type, and a selective gate 14, to form an MOS type selective transistor 7. This MOS type transistor 7 corresponds with the semiconductor 34b of FIG. 2(b). The selective gate 14 corresponds with the read word-line RWL of FIG. 2(b). A contact electrode 19 is connected, with one end, to the drain 12 of the MOS type selective transistor 7, and with the other end to an extended electrode 18. At the remote end of the extended electrode 18, there is implemented a first TMR element 16. The first TMR element 16 is has a pinned magnetic layer 16a made from a ferromagnetic film having a thickness of about 20 nm onto the end of the extended electrode 18, an insulating film 16b having a thickness of about 2 nm, and a free magnetic layer 16c made from a ferromagnetic film-having a thickness of about 20 nm. On the first TMR element 16 there is formed a first bit line 17. The first TMR element 16 corresponds with the element 34a of FIG. 2(b). A first word-line 15 is insulated via an insulating layer 21 from the extended electrode 18, and is arranged with respect to the first bit line 17 such that it intersects the latter when viewed flatly. The first word-line 15 corresponds with the write word-line WWL of FIG. 2(b). Thus, the MOS type selective transistor 7 and contact electrode 19 connected in series thereto, extended electrode 18, first TMR element 16, first bit-line 17, and first word-line 15 constitutes the first memory segment 10. A second memory segment 20 is formed above the first memory segment 10, and is insulated from the latter via an insulating layer 22. The second memory segment 20 comprises a second bit-line 27, a second TMR element 26 disposed onto a predetermined position with respect to the underlying second bit-layer 27, and a second word-line 25 laid on the top surface of the second TMR element 26. The second word-line 25 is arranged with respect to the second bit line 27 such that it intersects the latter when viewed flatly. The second bit line 27 corresponds with the bit-line BL of FIG. 2(a) while the second word-line 25 with the word-line WL of FIG. 2(a). The second TMR element 26 includes a pinned magnetic layer 26a made from a ferromagnetic film having a thickness of about 20 nm on the second bit-line 27, an insulating film having a thickness of about 2 nm, and a free magnetic layer 26c made from a ferromagnetic film having a thickness of about 20 nm in an insulating membrane 23.

Figure 4:
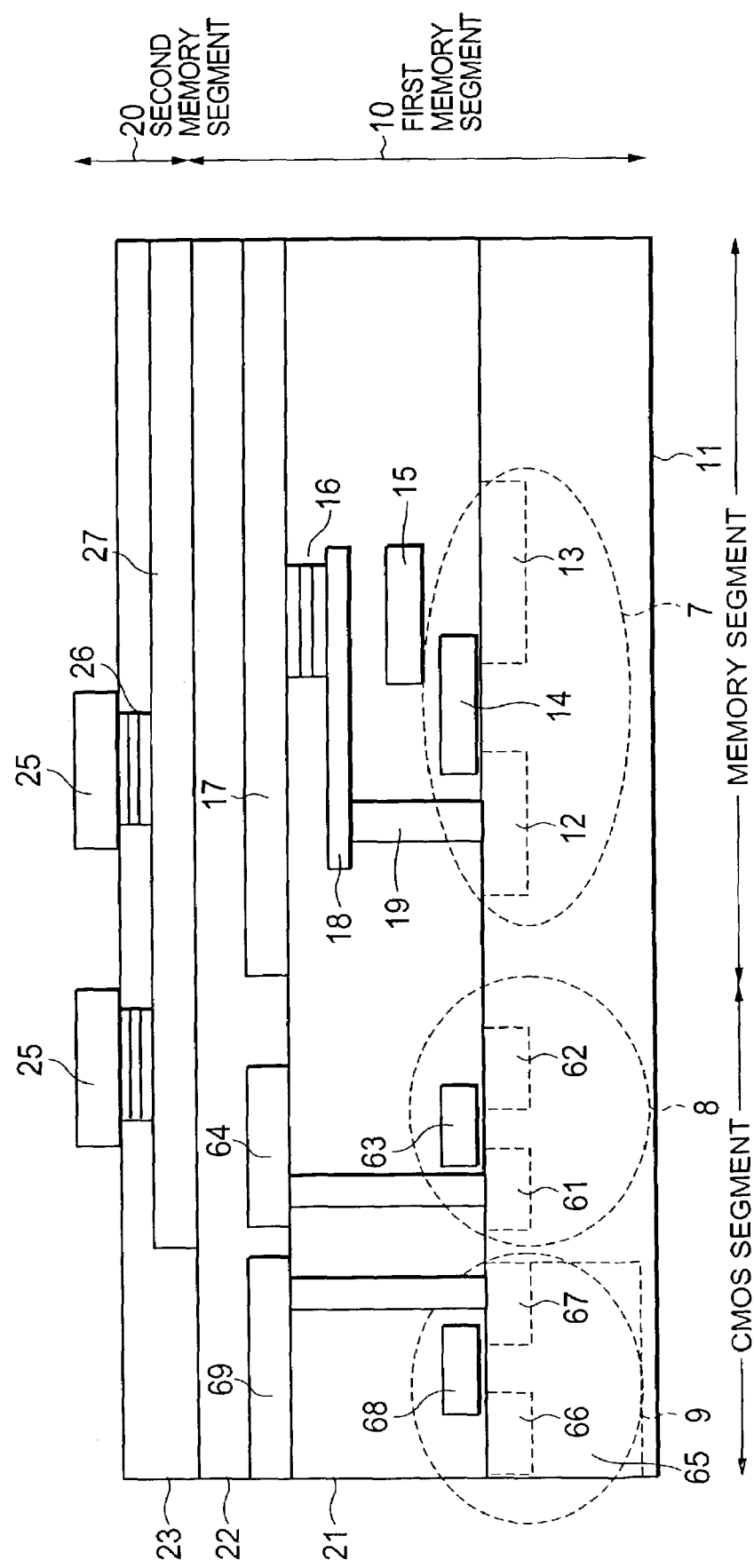
FIG. 4 shows the cross sectional view of another semiconductor memory device according to the first embodiment of the present invention.

FIG. 4 shows another structure of the same embodiment of this invention. In addition to the first memory segment 10 and the second memory segment 20, a CMOS area is provided as a logic circuit. The CMOS area comprises an NMOS transistor 8, and PMOS transistor 9. The NMOS transistor 8 comprises an N type drain 61, N type source 62, NMOS gate 63, and lead 64. The PMOS transistor 9 comprises a P type drain 66, P type source 67, PMOS gate 68, lead 69, and N type well 65. The second memory segment of FIG. 4 overlaps with the first memory segment 10 and a part of CMOS area when viewed flatly. A CMOS area includes a logic circuit consisting of decoders, etc., for activating memory cells formed in the first and second memory segments. The logic circuit constitutes a controller including the decoders/drivers of FIGS. 2(a) and 2(b), and input/output circuits in contact with an external interface. The CMOS area is connected as appropriate via leads and contacts with the first and second memory segments.

Next, a system incorporating a memory device of this invention will be described.

Figure 5:
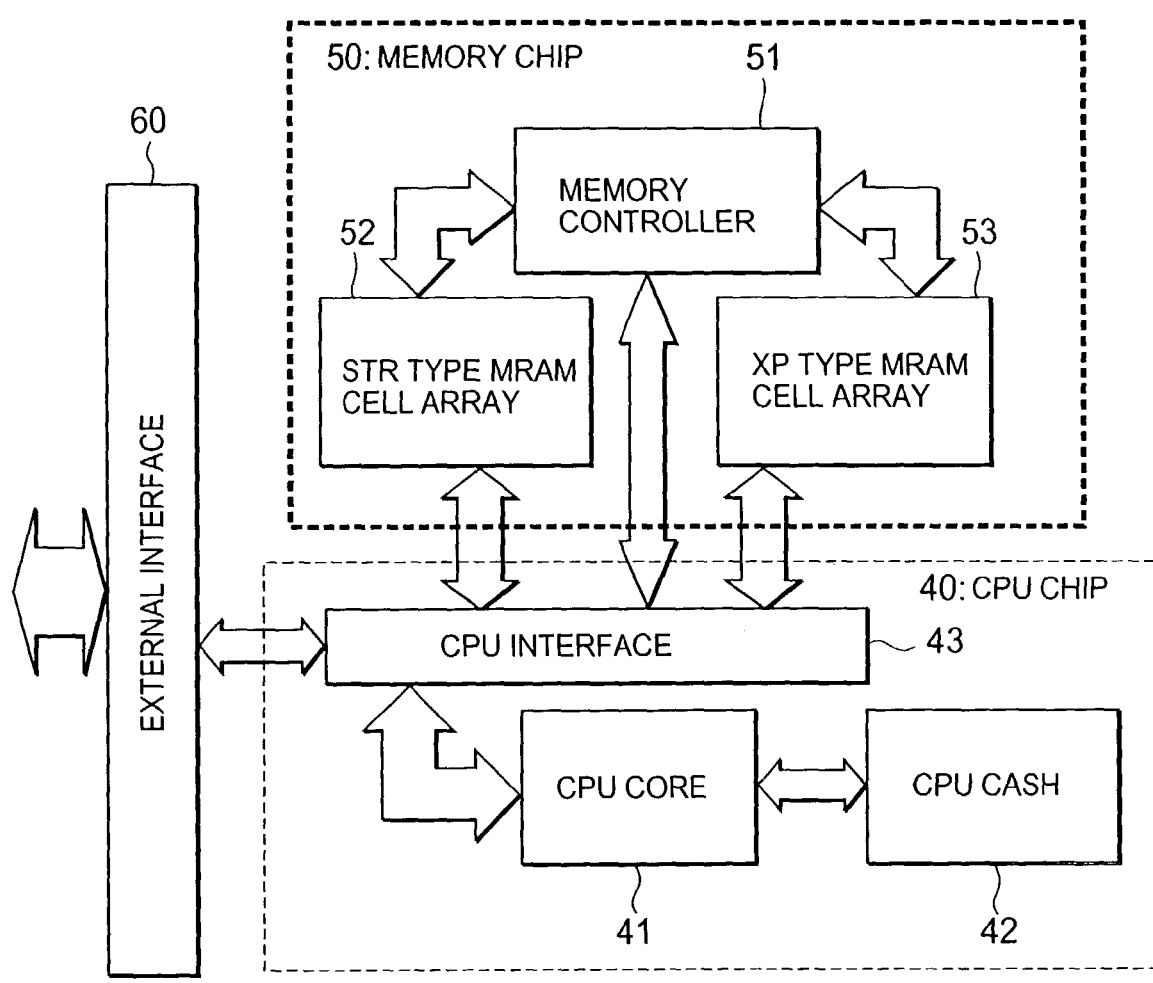
FIG. 5 shows the first constitution of the semiconductor memory device according to the first embodiment of the present invention.

FIG. 5 shows a system incorporating the semiconductor memory device according to the first embodiment of this invention. A memory controller 51 is formed in the logic circuit of the CMOS area of FIG. 4; an STr-MRAM 52 is formed in the first memory segment 10 of FIG. 4; and an XP-MRAM 53 is formed in the second memory segment 20 of FIG. 4. The STr-MRAM 52 serves, for example, as a working area, while the XP-MRAM as a data storage area. The memory controller 51 and STr-MRAM 52 and XP-MRAM 53 are formed on the same chip 50, that is, they form a single memory chip. A CPU chip 40 carries, for example, a CPU core 41, CPU cash 42 and CPU interface. The memory chip 50 may be combined with the CPU chip 40 into a single chip. Circuit elements 41, 42, 43; 51, 52, 53 and 60 are connected with each other via control buses such as address bus, data bus, etc.

The operation of the system embodying this invention will be described.

In the memory chip 50, the XP-MRAM 53 stores program codes. If the CPU chip 40 receives an input signal from outside via the external interface 60, it transmits to the memory chip 50 a signal notifying the execution of a program represented by the codes. The signal is transmitted via the CPU interface 43 to the memory controller 51. The memory controller 51 fetches the program codes stored in the XP-MRAM 53 and transfers them to the STr-MRAM 52. The memory controller 51, by referring to the program codes stored in the STr-MRAM, executes a program represented by the codes, and delivers the execution result as an output via the input/output circuits within the external interface 60 and output circuit to outside.

According to this invention, it is possible to constitute both work and data storage areas with MRAM cells simple in structure. On the contrary, if a memory device includes a DRAM as a working area, and an XP-MRAM as a data storage area, the manufacture of the device will become cumbersome, because the capacitor components of DRAM will require complicated processes for production.

Figure 6:
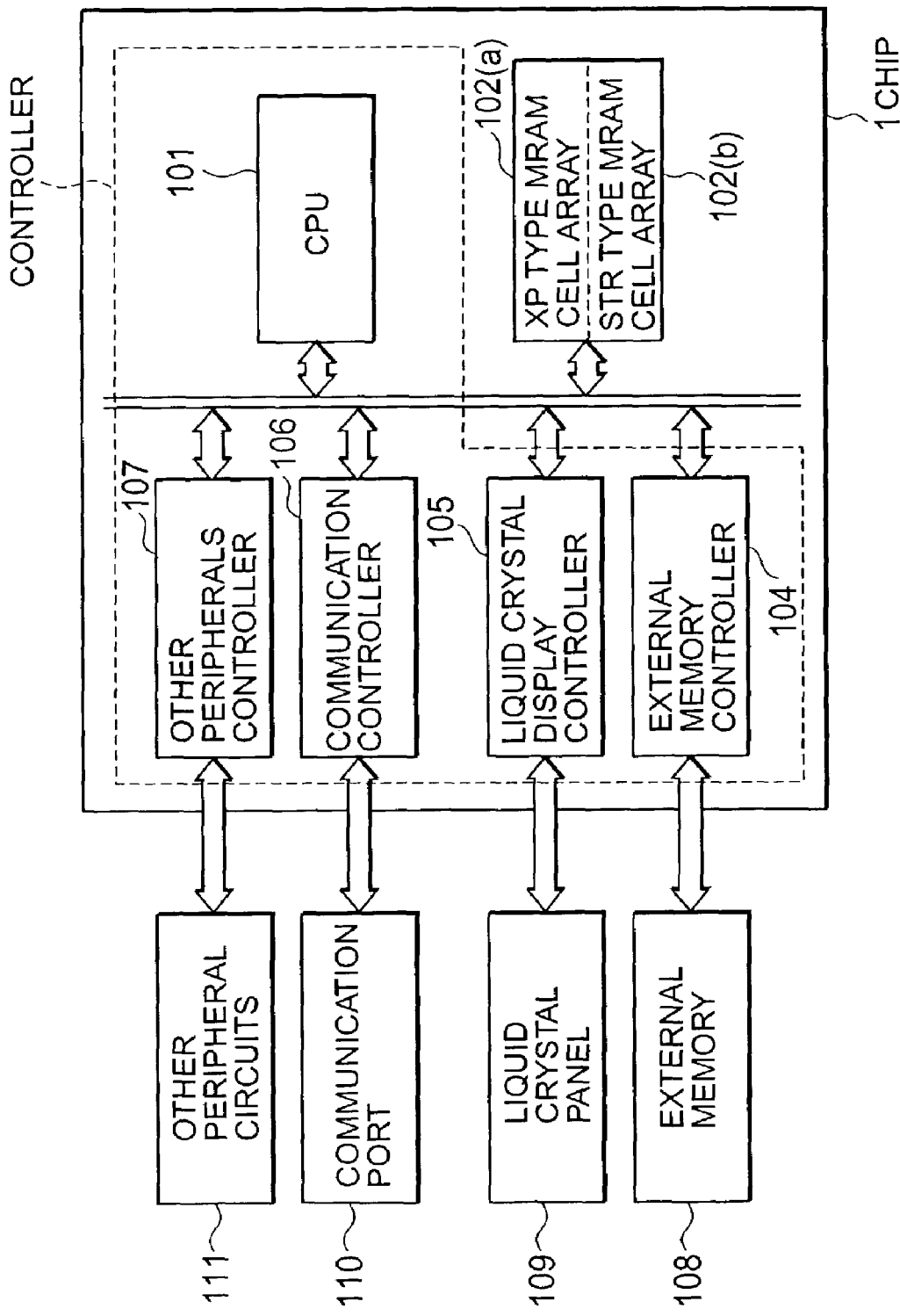
FIG. 6 shows the second constitution of a semiconductor memory device according to the first embodiment of the present invention.

FIG. 6 shows a second system incorporating a semiconductor memory device of this invention. The system shown in FIG. 6 represents a mobile phone incorporating a memory chip of this invention. An XP-MRAM 102(*a*) stores instructions such as OS, communication protocols, etc.; static data such as codes related with icons, fonts, melody, and dictionaries accessible by voice input, etc.; and erasable data such as screen memos, call notifying sounds, messages, phone number lists, etc. For example, software packages assisting scheduling, storage of phone numbers, music downloading, electronic transactions, mail exchange, Web search, etc., are stored in the XP-MRAM 102(*a*) Furthermore, music/animation data downloaded based on music/animation communication protocol may be stored in this memory component. The STr-MRAM is used as a working area when a software program stored in the XP-MRAM is used. The CPU 101 acting as a controller transfers a software program registered in the XP-MRAM as needed to the STr-MRAM for its execution. The controller executes control functions necessary for the proper operation of a mobile phone, the function including communication of signals with a base station via a communication port 110, control of communication based on USB/IrDA, 106, control of external memory controller which is responsible for controlling access to an external memory, 104, and control of a display panel 109 such as a STN or TFT liquid crystal display. The controller may include additional peripheral controllers 107 such as a controller for controlling the data processing necessary for the compression/expansion of image data, and a controller for controlling power supply. These controllers, and the XP-MRAM and STr-MRAM are arranged on a single chip in the manner as described above. The controller needs not include all the control functions 101, 104-107 described above. For example, the communication controller 106 may be implemented on another chip.

Figure 7:
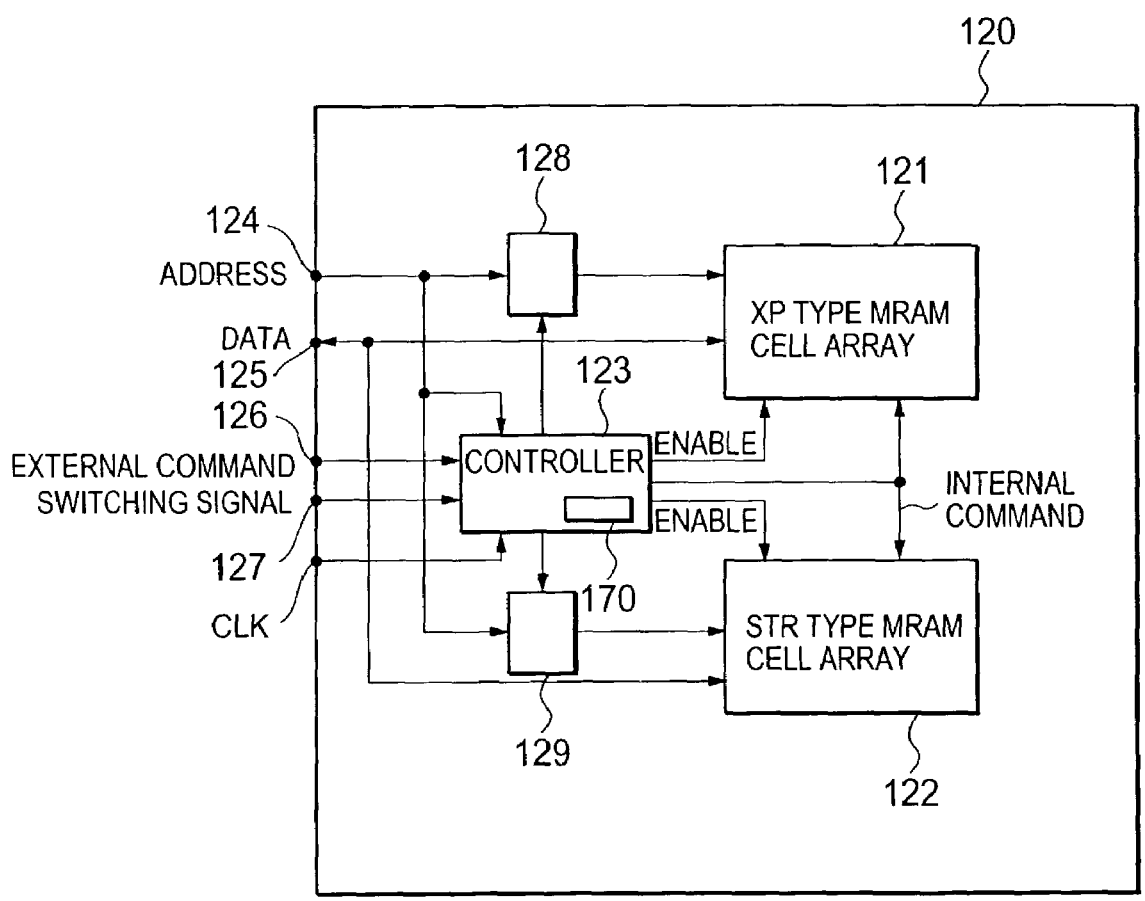
FIG. 7 shows the third constitution of a semiconductor memory device according to the first embodiment of the present invention.
Figure 8A:
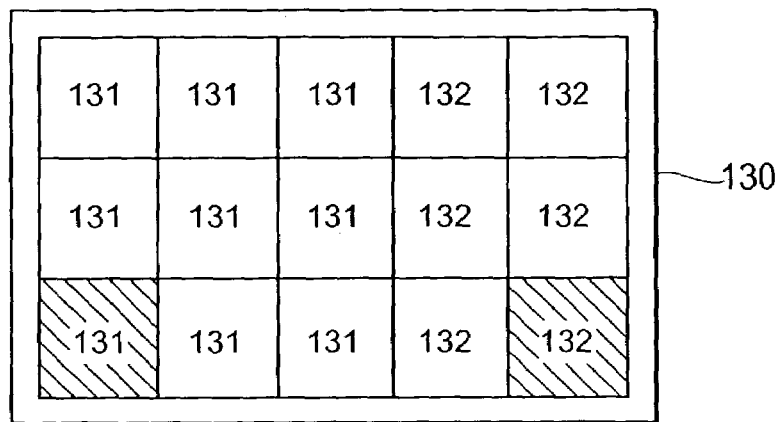
FIGS. 8(a) to 8(d) show layouts of the semiconductor memory device according to the first embodiment of the present invention.
Figure 8B:
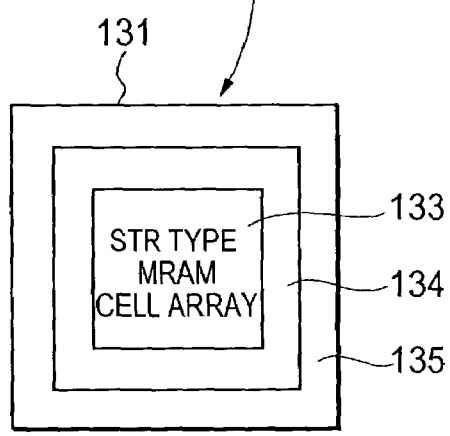
Figure 8C:
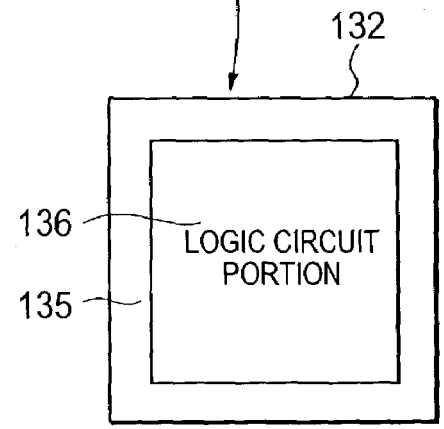
Figure 8D:
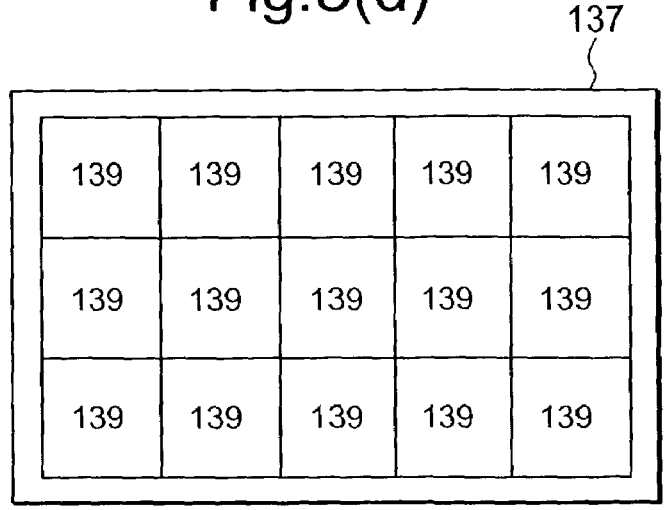

FIG. 7 shows a semiconductor memory device representing a third constitution of the first embodiment.

This memory device embodying this invention is obtained by arranging an XP-MRAM 121, an STr MRAM 122 and a controller 123 on a single chip 120. The two MRAMs 121, 122 are commonly connected to an address pin 124 via an XP-MRAM and STr-MRAM buffers 128, 129, respectively. The two MRAMs 121, 122 receive the same input. A controller 123 receives an external instruction signal via a command pin 126, and a switching signal via a pin 127. In response to the switching signal, the controller 123 inactivates one of the XP-MRAM 121 and STr-MRAM 122 and activates the other. In addition, the controller 123 converts the external signal into two internal signals, and distributes them to the two MRAMs 121, 122. The MRAMs thus activated reads or writes data as appropriate based on an internal command delivered and nominated address. The bit width of address used by the XP-MRAM and STr-MRAM may vary as appropriate. For examples, for an XP-MRAM 121 having a big capacity, the bit width of address may take a maximum permissible quantity, while for an STr-MRAM 122 having a small capacity, the bit width of address may consist of several lower bits.

The semiconductor memory device shown in FIG. 7 may achieve only the functions as described below. Namely, the semiconductor memory device transmits an address signal to a register 170 whenever it receives a switching signal. However, as long as the semiconductor memory device does not receive a switching signal, it retains the address signal. The register 170 is for determining which an incoming address is directed to, to the XP-MRAM 121 or to the STr-MRAM 122. For example, when the switching signal port remains open, first and second addresses directed to the XP-MRAM and STr-MRAM respectively are introduced. When the switching signal port has been closed, and a first address directed to the XP-MRAM is introduced to chip 120, the controller 123 compares that first address with the address previously stored in the register 170, and, whenever it finds they are the same, it transmits an activation signal to the buffer 128 while it inactivates the buffer 129. In response to the activation signal, the buffer 128 causes the address signal to be transmitted to the XP-MRAM 121 at a proper timing.

FIGS. 8(*a*) to 8(*d*) show an example of the layout of a semiconductor memory device of this invention.

FIG. 8(*a*) gives a flat view of a first memory area (see FIG. 4) of the semiconductor chip 30 of this invention. The first memory area of a chip 130 includes a section comprising plural STr-MRAMs 131 and another section comprising logic circuits 132.

As shown in FIG. 8(*b*), each STr-MRAM unit 131 comprises an array of STr-MRAM cells 133 at its center surrounded sequentially by a peripheral circuit portion 134 and another peripheral circuit portion 135. The central circuit portion 134 comprises a decoder, driver, sense amplifier, etc. for the STr-MRAM cell array 133, while the marginal circuit portion 135 includes a peripheral circuit portion 135 for the XP-MRAM.

As shown in FIG. 8(*c*), each logic circuit unit 132 comprises a logic circuit portion 136 at its center surrounded by a peripheral circuit portion 135 consisting of an XP-MRAM cell array.

FIG. 8(*d*) gives a flat view of a second memory area of the semiconductor memory device 130 of this invention. The second memory area includes plural XP-MRAM units 139. Each XP-MRAM unit 139 comprises an array of XP-MRAM memory cell arrays covering nearly the entire surface of the unit. This memory cell array is driven by the peripheral circuit portion 135 formed on the first memory area and implemented for managing another XP-MRAM memory cell array.

Figure 9:
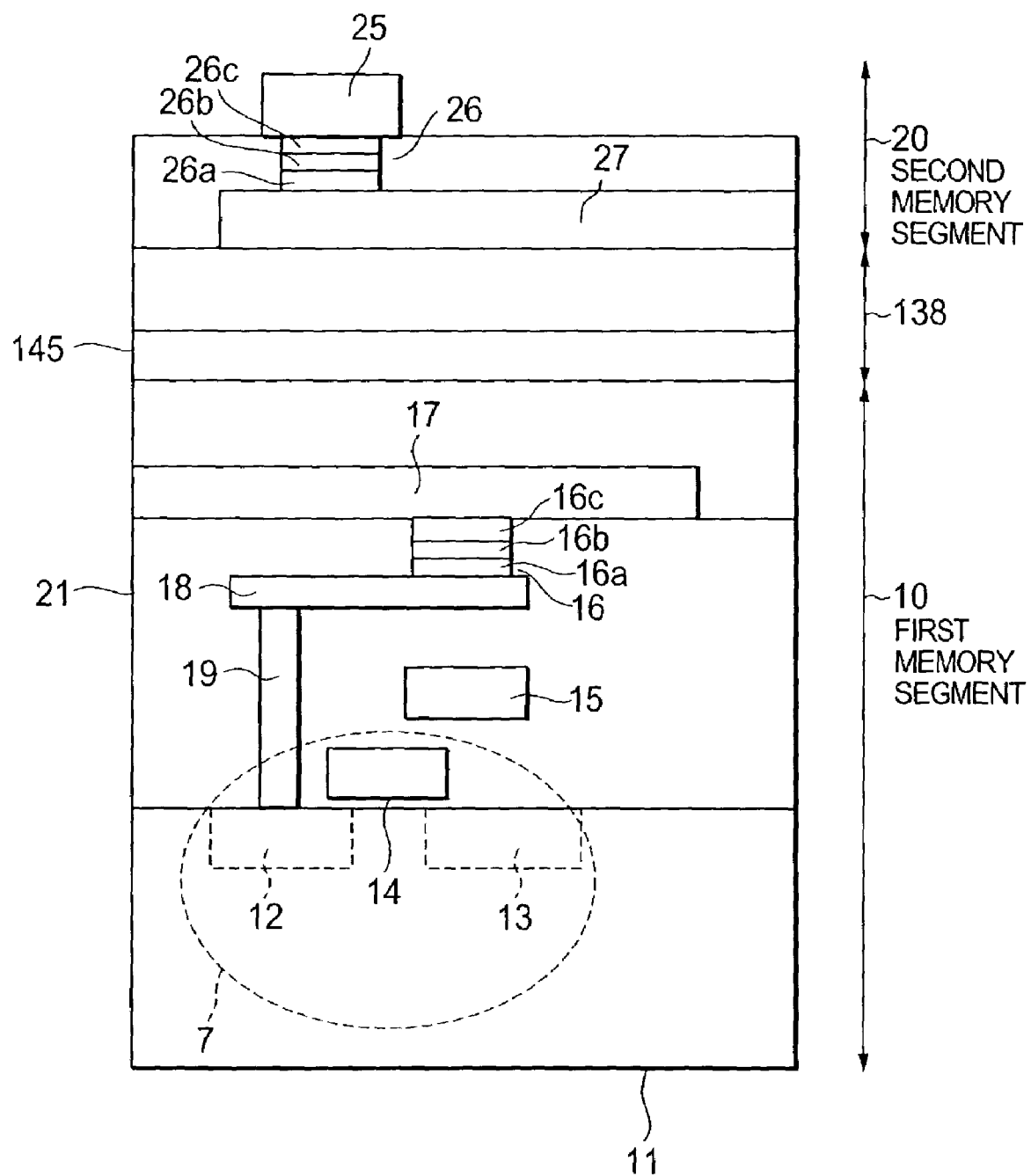
FIG. 9 shows the another cross sectional view of the semiconductor memory device according to the first embodiment of the present invention.

Description of how external pins should be arranged on the margin of the semiconductor memory device of this invention has been omitted, but they should be arranged in a usual manner. Description of how those external pins should be connected with other peripheral circuit elements has been omitted. However, to mention a few as an example, an I/O cable may be connected to the second memory area, or be inserted between each pair of adjacent XP-MRAM units 139. Or, two logic circuit units 132 may sandwich a STr-MRAM unit 131. Or, a lead connected to an STr-MRAM peripheral circuit portion 134 and to a logic circuit portion 136 may be arranged as follows: the lead comes to a junction with a neighboring STr-MRAM unit 131, turns round into a junction with a neighboring logic circuit unit 132, enters into a peripheral circuit portion for XP-MRAM 135 close to a junction between the apposed STr-MRAM unit 131 and XP-MRAM 135, and is then extracted upwards to be connected via a contact to an upper line. Or, as shown in FIG. 9, a wiring segment 138 is implemented between the first and second memory portions for accepting leads 145 for control signals.

The leads 145 for control signals are connected as appropriate via contacts to external peripheral circuits 134, 135 and to logic circuits 136.

Figure 10:
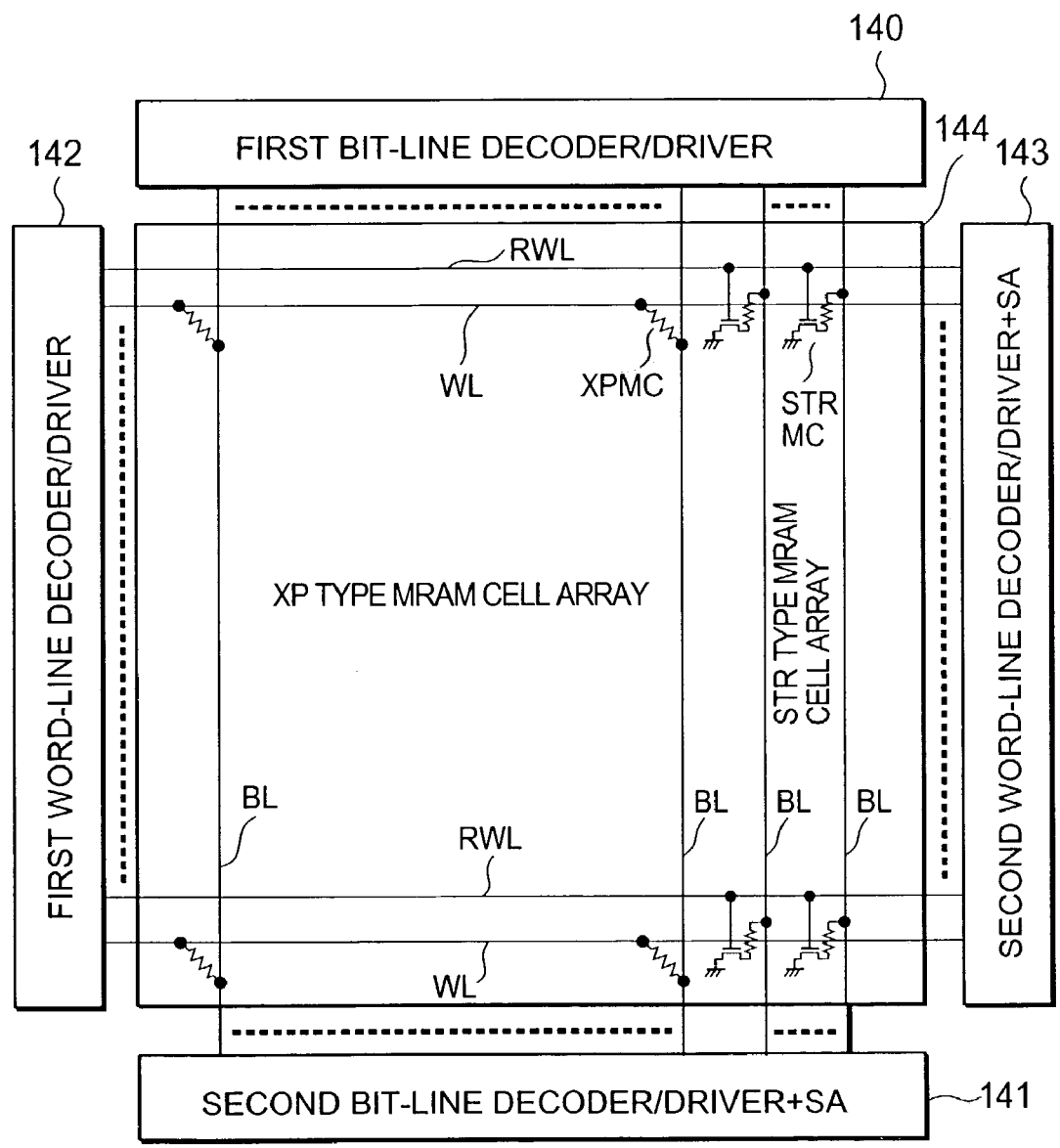
FIG. 10 shows a semiconductor memory device according to the second embodiment of the present invention.

FIG. 10 shows a semiconductor memory device representing a second embodiment of this invention.

With this memory device, each pair of word-line WL and read word-line are shared by XP-MRAM and STr-MRAM cells disposed on the same column. A pair of word-line WL and read word-line RWL are connected to each memory cell MC, and there are plural such memory cells MC. A memory cell array 144 includes two sub-arrays in its area: one sub-array consists of an XP-MRAM memory cell array while the other of an STr-MRAM memory cell array. Because those sub-arrays have the same structures as do the corresponding arrays shown in FIGS. 2(a) and 2(b) described above, their description will be omitted. In contact with both ends of each pair of word-line WL and read word-line RWL, there are implemented first and second decoders/drivers 142, 143. The decoder/driver 143 can be omitted. The decoder/driver 143 does not include a sense amplifier. In contact with both ends of bit-lines BL, there are implemented first and second bit-line decoders/drivers 140, 141.

If the sub-array consisting of XP type memory cells and the sub-array consisting of STr type memory cells have a layered structure as shown in FIG. 3, then each first word-line 15 and a corresponding second word-line 25 as shown in FIG. 3 will contact with each other via a contact.

Figure 11A:
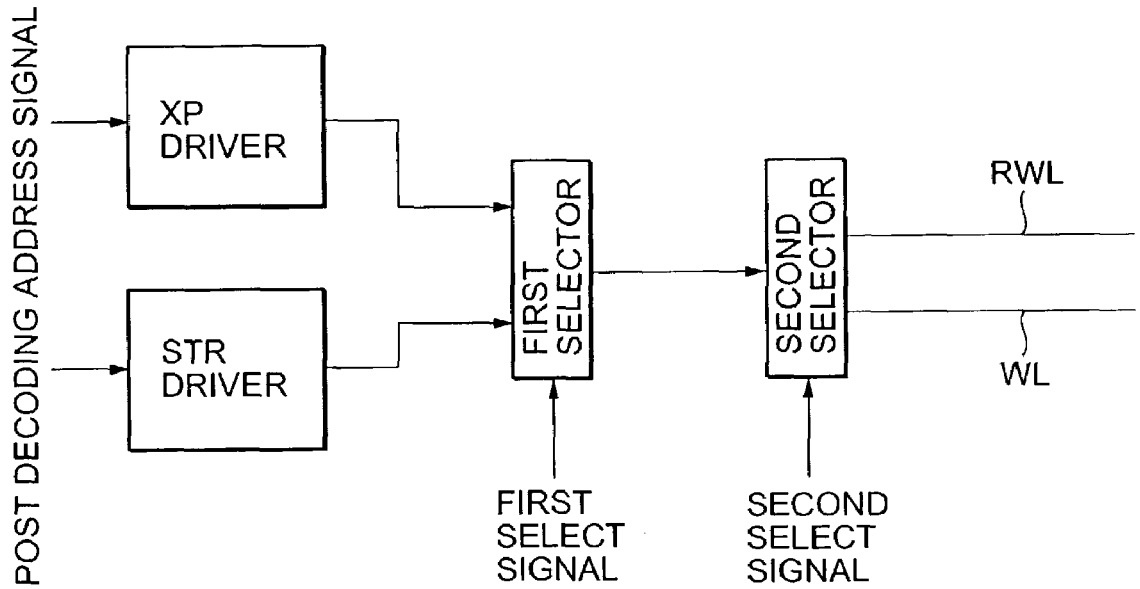
FIGS. 11(a) and 11(b) show the constitutions of the decoder/driver shown in FIG. 10.

As shown in FIG. 11(a), the first and second word-line decoders/drivers 142, 143 receive outputs, for a given pair of word-line WL and read word-line RWL, from an XP and STr drivers; select one out of those outputs depending on a select signal received via a first selector; transmit it to a second selector; and then transmit it either to the read word-line RWL or to the word-line WL depending on a second select signal received via a second selector. When it is required to write or read data into or from an XP memory cell, the decoders/drivers transmit an output from the XP driver to the word-line WL leading to the target memory cell. When it is required to read data from an STr memory cell, the decoders/drivers transmit an output from the STr driver to the read word-line RWL to the target memory cell. First and second select signals are distributed to the first and second selectors in such a manner as to allow the respective outputs to be properly delivered to their appropriate target memory cells.

Figure 11B:
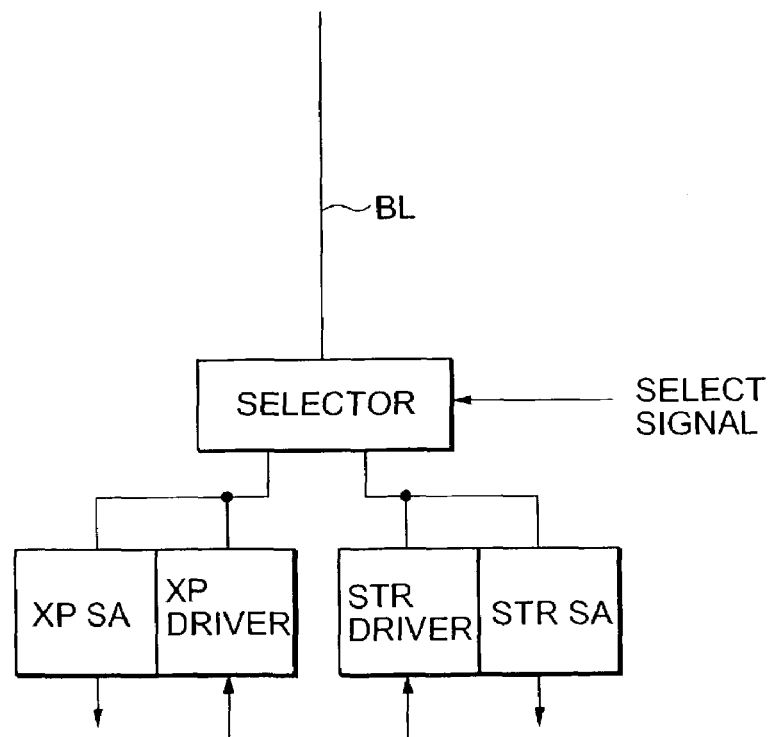

As shown in FIG. 11(b), the first and second bit-line decoders/drivers 140, 141 contain a selector. The selector, when it recognizes there are outputs from an XP and STr drivers for a given bit-line BL, and writing of data into an XP memory cell connected to the bit-line is required, connects the XP driver to the bit-line so that the output from the XP driver is transmitted to the target memory cell connected to the bit-line. However, when reading of data from the same memory cell is required, the selector connects an XP sense amplifier to the bit-line in question. On the other hand, when it recognizes writing of data into an STr memory cell is required, it connects the STr driver to the bit-line BL so that the output from the STr driver is transmitted to the target STr memory cell connected to the bit-line. However, when reading of data from the same STr memory cell is required, the selector connects an STr sense amplifier to the bit-line in question.

Figure 12:
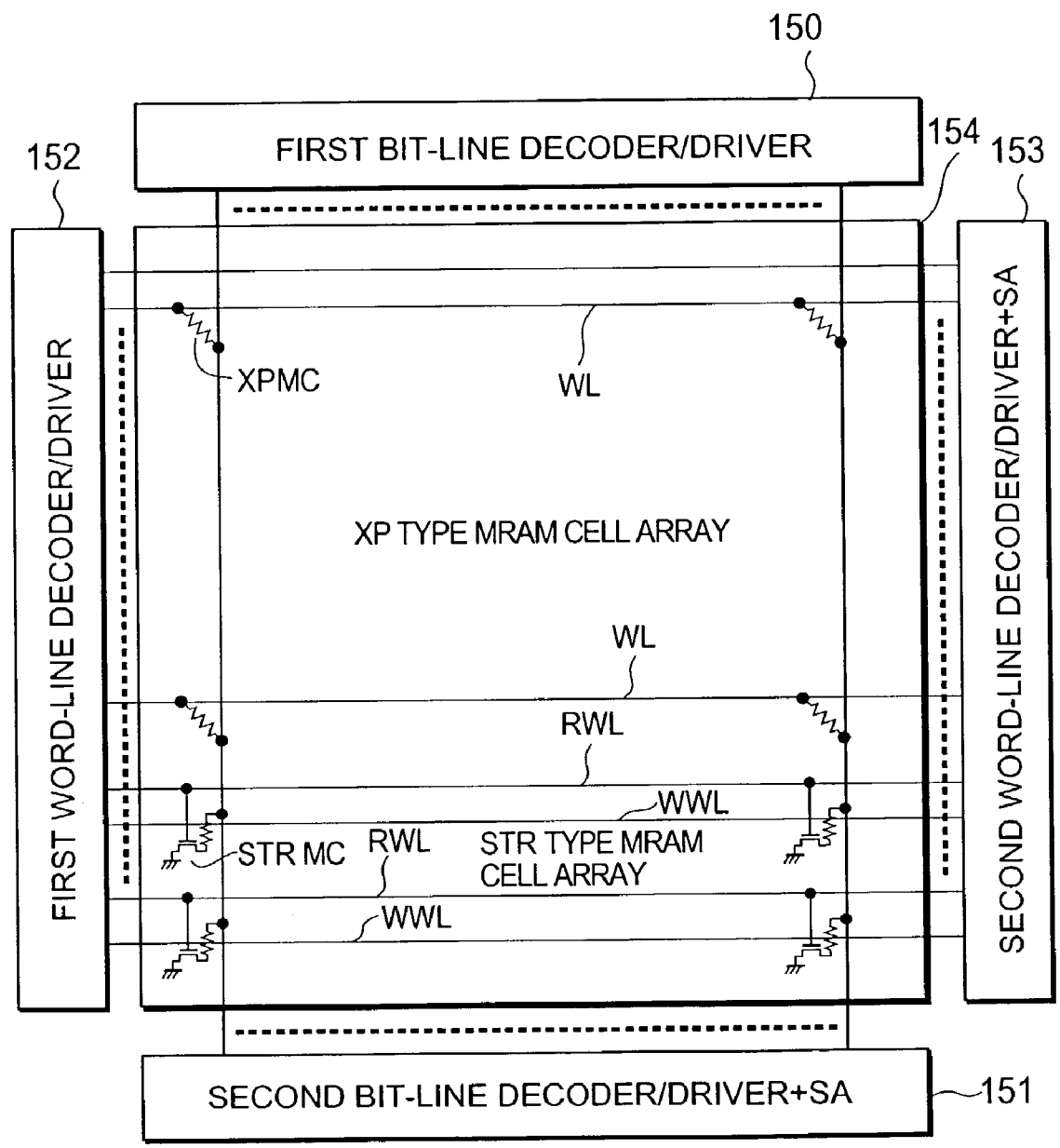
FIG. 12 shows the semiconductor memory device representing the third embodiment of the present invention.
Figure 13A:
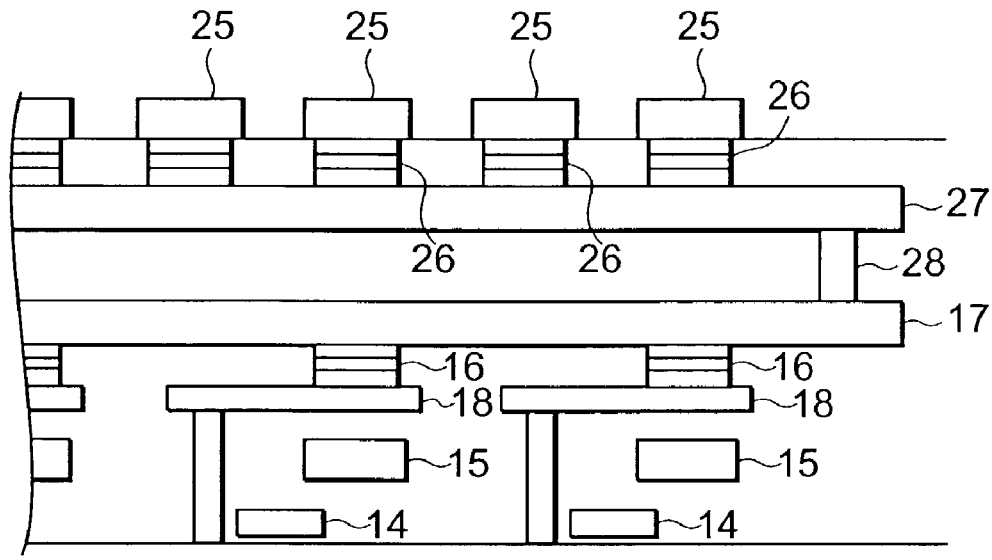
FIGS. 13(a) and 13(b) show a cross-section of the memory area of the semiconductor memory device shown in FIG. 12, and a top-view layout of the memory area, respectively.
Figure 13B:
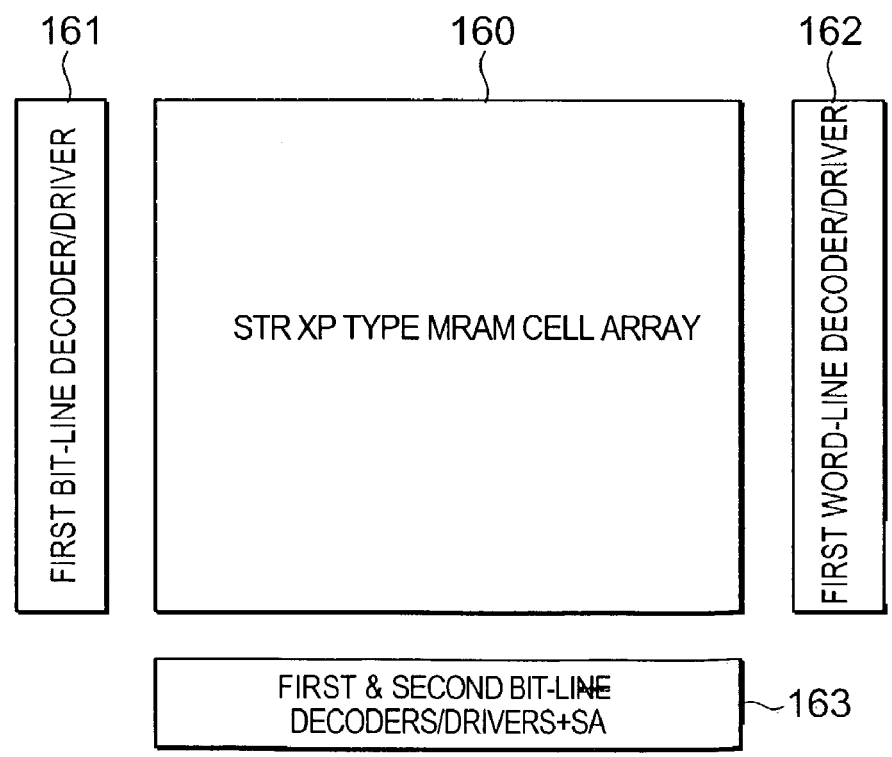

FIG. 12 shows a semiconductor memory device representing a third embodiment of this invention. With this memory device, each bit-line BL is shared by XP-MRAM and STr-MRAM cells disposed on the same row. The configuration of the decoder and drives of this embodiment is essentially the same with that of the memory cell array shown in FIG. 10, its description will be omitted. According to the embodiment, if a sub-array consisting of XP type memory cells and sub-array consisting of STr type memory cells have a layered structure, then each first bit-line 17 and a corresponding second bit-line 27 as shown in FIG. 13(a) will contact with each other via a contact. Accordingly, it is possible to arrange the first and second bit-line decoders/drivers on one side of the memory cell array as shown in FIG. 13(b). If it is required to achieve data writing as desired to an XP-MRAM memory cell and to an STrMRAM memory cell both connected to a given bit-line independently of each other, following procedures may be employed. The driver 151 is caused to pass predetermined current through the bit-line; current is passed through a first word-line WL running along the column of a desired XP-MRAM memory cell; current is also passed through a second word-line WL running along the column of a desired STr-MRAM memory cell; and thereby simultaneous and independent writing of desired data into the XP-MRAM and STr-MRAM memory cells connected to the same bit-line is achieved. During this operation, the same driver is applied to both XP-MRAM and STr-MRAM memory cell arrays. The decoder/driver 153 can be omitted. The decoder/driver 153 does not include a sense amplifier.

As has been detailed above, the semiconductor memory device of this invention is obtained by arranging an STr type MRAM array and an XP type MRAM array on a single chip, in contrast with the conventional processing where the two arrays are prepared on separate chips. This arrangement allows the two arrays to be controlled by a single common memory controller. Moreover, according to this invention, because the XP-MRAM cell array where a TMR is inserted at each cross-point between word-lines and bit-lines, is laid over the STr-MRAM cell array to take a layered structure, it is possible to allow a common controller to control the two memory cell arrays without requiring an extra space for combining the two memory arrays.

The present invention is not limited only to the above embodiments and examples, but may include many variations and modifications as long as those variations and modifications are included within the scope of this invention which is defined by the appended claims.

What is claimed is:

1. A semiconductor memory device, comprising:
    a selective transistor (STr) type magnetic memory cell array including a plurality of STr type magnetic memory cells, at least one of said cells being arranged between a first bit line and a first word line and having a selective transistor for selectively reading out a data stored in the at least one Str type magnetic memory cell;
    a cross-point (XP) type magnetic memory cell array, said XP type magnetic memory cell array including a plurality of XP type magnetic memory cells, at least one of said XP type magnetic memory cells being arranged between a second bit line and a second word line and is capable of reading out a data stored in the at least one XP magnetic memory cell by using said second bit and word lines;
    a controller comprising a first decoder coupled to said STr type magnetic memory cell array to provide read or write operation and a second decoder coupled to said XP type magnetic memory cell array to provide read or write operation,
    wherein said controller is integrated in common in a single unitary body of a semiconductor substrate,
    wherein said memory cell arrays are formed on said body; and
    wherein said XP type magnetic memory cell array is laid over said STr type magnetic memory cell array.

2. The device as claimed in claim 1, wherein a tunnel magnetic resistor of said STr type magnetic memory cell has a resistance lower than that of a tunnel magnetic resistor of said XP type magnetic memory cell.

3. The device as claimed in claim 2, wherein said STr type magnetic memory cell array serves as a work memory area, while said XP type magnetic memory cell array serves as a data storage area.

4. The device as claimed in claim 1, wherein the controller controls in common data write/read operations of said STr type and XP type magnetic memory cell arrays.

5. The device as claimed in claim 4, wherein:
said XP type magnetic memory cell array stores an application program of a mobile phone;
said STr type magnetic memory cell array stores data which has been obtained as a result of the execution of the application program stored in the XP type magnetic memory cell memory; and
said controller further contains a CPU which controls a communication controller which receives communication information from outside.

6. The device as claimed in claim 4, wherein:
said controller activates one of said STr type magnetic memory cell array and XP type magnetic memory cell array; and
an address signal is introduced into the activated one of said STr and XP type magnetic memory cell arrays.

7. The device as claimed in claim 1, wherein:
a first peripheral circuit for the STr type magnetic memory cell array is arranged around said STr type magnetic memory cell array;
a second peripheral circuit for said XP type magnetic memory cell array is arranged around said first peripheral circuit.

8. The device as claimed in claim 7 wherein:
said XP type magnetic memory cell array is formed over said Str type magnetic memory cell array and said first and second peripheral circuits.

9. The device as claimed in claim 1, wherein:
said first word line is commonly connected to said second word line.

10. The device as claimed in claim 1, wherein:
said first bit line is commonly connected to said second bit line.

11. The device as claimed in claim 1 wherein:
said first bit line is connected via a contact with said second bit line.

12. The device as claimed in claim 1, wherein:
said STr type magnetic memory cell array is formed adjacent to the memory controller.

13. The device as claimed in claim 12, wherein:
said XP type magnetic memory cell array extends beyond the STr type magnetic memory cell array and reaches over said memory controller on the single substrate.

14. The device as claimed in claim 1, wherein said XP type magnetic memory cell array is laid directly over said STr type magnetic memory cell array.

15. A semiconductor memory device, comprising on a single chip:
a selective transistor (STr) type magnetic memory cell array including a plurality of STr type magnetic memory cells, at least one of said cells being arranged between a first bit line and a first word line and having a selective transistor for selectively reading out a data stored in the at least one Str type magnetic memory cell;
a cross-point (XP) type magnetic memory cell array, said XP type magnetic memory cell array including a plurality of XP type magnetic memory cells, at least one of said XP type magnetic memory cells being arranged between a second bit line and a second word line and is capable of reading out a data stored in the at least one XP magnetic memory cell by using said second bit and word lines; and
a memory controller for controlling data write/read operation of said STr type and XP type magnetic memory cell arrays;
wherein said first word line is commonly connected to said second word line; and
wherein a data is respectively written into said XP type magnetic memory cell and said STr type magnetic memory cell by applying a first current to said first and second word line, a second current to said first bit line and a third current to said second bit line.

16. The device as claimed in claim 15, further comprising:
a read word line coupled to said STr magnetic memory cell;
a selector selecting one of said word line and said read word line;
a XP driver coupled to said selector, said XP driver supplying a current with said XP type magnetic memory cell array; and
a STr driver coupled to said selector, said STr driver supplying a current with said STr type magnetic memory cell array.

17. The device as claimed in claim 15 wherein:
the same data is written into said XP type magnetic memory cell by applying a first current to said first and second bit lines, a second current to said first word line and a third current to said second word line.

18. The device as claimed in claim 17, further comprising:
a selector coupled to said first and second bit lines;
a XP driver coupled to said selector, said XP driver supplying a current with said XP type magnetic memory cell array;
a STr driver coupled to said selector, said STr driver supplying a current with said STr type magnetic memory cell array;
a XP amplifier for said XPr type magnetic memory cell array and coupled to said selector; and
a STr amplifier for said STr type magnetic memory cell array and coupled to said selector.

* * * * *